(12) United States Patent
Baek

(10) Patent No.: US 7,601,557 B2
(45) Date of Patent: Oct. 13, 2009

(54) METHOD OF MANUFACTURING IMAGE SENSOR

(75) Inventor: In Cheol Baek, Suwon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/137,612

(22) Filed: Jun. 12, 2008

(65) Prior Publication Data

US 2008/0311691 A1   Dec. 18, 2008

(30) Foreign Application Priority Data

Jun. 12, 2007   (KR) ...................... 10-2007-0057094

(51) Int. Cl.
   *H01L 21/20*   (2006.01)
(52) U.S. Cl. ................... 438/70; 257/E31.127; 438/66
(58) Field of Classification Search ................... 438/57, 438/66, 70, 71, 73, 370, 528, 745, 756, 757
See application file for complete search history.

(56) References Cited

U.S. PATENT DOCUMENTS

| | | | | |
|---|---|---|---|---|
| 2006/0189024 A1* | 8/2006 | Kao et al. | ...................... | 438/69 |
| 2007/0161147 A1* | 7/2007 | Kim | ........................... | 438/70 |
| 2008/0151378 A1* | 6/2008 | Kim | ........................... | 359/626 |
| 2008/0156767 A1* | 7/2008 | Yun et al. | ...................... | 216/26 |
| 2008/0160665 A1* | 7/2008 | Cho | ............................ | 438/70 |
| 2008/0272452 A1* | 11/2008 | Hwang | ....................... | 257/432 |
| 2008/0314864 A1* | 12/2008 | Shin | ............................ | 216/12 |
| 2009/0108386 A1* | 4/2009 | Park | ........................... | 257/432 |

* cited by examiner

*Primary Examiner*—Savitri Mulpuri
(74) *Attorney, Agent, or Firm*—Saliwanchik, Lloyd & Saliwanchik

(57) ABSTRACT

Provided is a method of manufacturing an image sensor. A microlens of inorganic material can be formed on a substrate by forming a seed microlens having a top surface with height differences, and then blanket etching the seed microlens to form a dome shaped microlens having a curvature following the height differences of the seed microlens. The height differences in the top surface of the seed microlens can be created by implanting nitrogen at different depths into an inorganic layer to form ion implantation regions, and removing the ion implantation regions from the inorganic layer.

13 Claims, 4 Drawing Sheets

METHOD OF MANUFACTURING IMAGE SENSOR

CROSS-REFERENCE TO RELATED APPLICATION

The present application claims the benefit under 35 U.S.C. §119 of Korean Patent Application No. 10-2007-0057094, filed Jun. 12, 2007, which is hereby incorporated by reference in its entirety.

BACKGROUND

An image sensor is a semiconductor device that converts an optical image into an electrical signal. The image sensor can be classified as a charge coupled device (CCD) image sensor or a complementary metal oxide semiconductor (CMOS) image sensor (CIS).

A unit pixel of a CIS includes a photodiode and a metal oxide semiconductor (MOS) transistor. Therefore, the CIS sequentially detects an electrical signal of the unit pixel in a switching manner to generate an image.

Although efforts are being made to increase the fill factor of the image sensor for improving optical sensitivity, there is a limitation in increasing the fill factor because of the logic circuitry region in a pixel area.

To improve the optical sensitivity, a method of forming a microlens has been developed, which concentrates incident light out of a light-sensing region onto the light-sensing region.

The microlens is typically formed on a pixel array substrate according to pixels. Often, the microlens is formed on a color filter.

The microlens is formed in a dome shape by sequentially performing exposure, development, and reflow processes on a photosensitive organic material.

However, since the photosensitive organic material has a weak physical property, the microlens is susceptible to cracking from physical impact during subsequent package and bump processes. Also, the photosensitive organic material has relatively strong viscosity and may generate a defective microlens due to the adsorption of particles.

BRIEF SUMMARY

Embodiments of the present invention provide an image sensor and a method of manufacturing an image sensor that can employ a microlens of an inorganic material. According to an embodiment, the inorganic material can inhibit particle accumulation and cracking.

In one embodiment, a method of manufacturing an image sensor comprises: forming a plurality of unit pixels on a semiconductor substrate, each unit pixel comprising a photodiode and a metal oxide semiconductor transistor; forming an interlayer dielectric and a metal interconnection on the semiconductor substrate; forming an inorganic layer on the interlayer dielectric; selectively forming an ion implantation region in a portion of the inorganic layer corresponding to a area between the unit pixels; removing the ion implantation region to form a seed microlens comprising a lens gap hole in the inorganic layer, the lens gap hole comprising a shallow and wide trench-shaped upper portion and a deep and narrow via-shaped middle portion, wherein a surface of the seed microlens has a height difference due to the lens gap hole; and performing a blanket etching process on the seed microlens to form a microlens.

The details of one or more embodiments are set forth in the accompanying drawings and the description below. Other features will be apparent from the description and drawings, and from the claims.

DETAILED DESCRIPTION

FIGS. 1 to 8 are cross-sectional views illustrating a process of manufacturing an image sensor according to embodiments.

Figure 1:
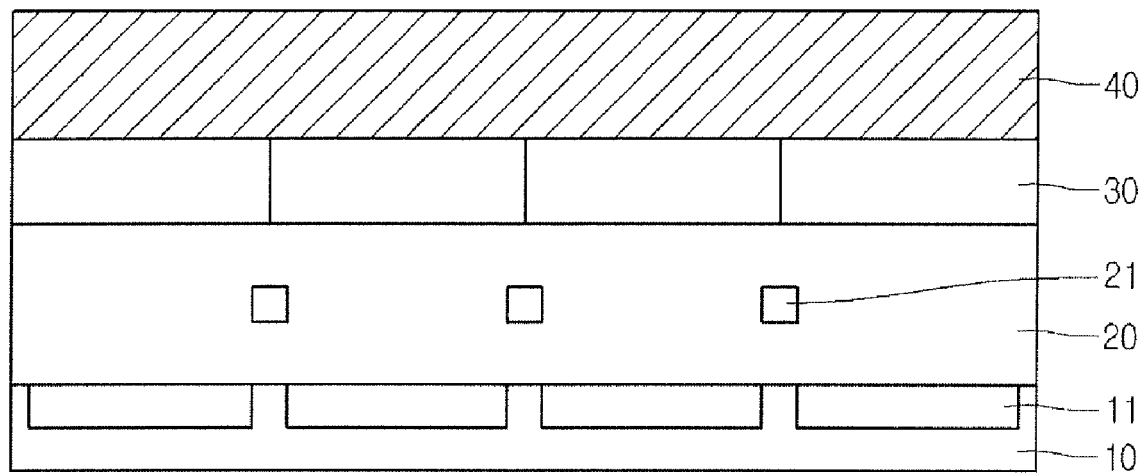
FIGS. 1 to 8 are cross-sectional views illustrating a process of manufacturing an image sensor according to an embodiment of the present invention.

Referring to FIG. 1, unit pixels 11 can be defined on a semiconductor substrate 10. Each unit pixel can include a photodiode (not shown) and complimentary metal oxide semiconductor (CMOS) circuitry (not shown). The CMOS circuitry can include a MOS transistor.

A device isolation layer (not shown) can be used to define an active region and a field region on the semiconductor substrate 10 including each unit pixel 11. The photodiode of the unit pixel 11 receives light to generate a photo-charge, and the CMOS circuitry is connected to the photodiode to convert the received photo-charge into an electric signal.

After devices including the unit pixels 11 are formed, an interlayer dielectric 20 and a metal interconnection 21 can be formed on the semiconductor substrate 10.

The interlayer dielectric 20 can be formed to have a plurality of layers. In addition, the metal interconnection 21 can be provided in plurality.

According to embodiments of the present invention, the metal interconnections 21 are laid out so as to not interfere with incident light to the photodiode.

Although not shown, a passivation layer can be formed on the interlayer dielectric 20 including the metal interconnections 21.

The passivation layer can be formed of a dielectric to protect a device from humidity or a scratch. For example, the passivation layer can be formed of a silicon oxide, a silicon nitride, a silicon oxynitride, or one or more of such layers that are stacked.

Color filters 30 can be formed on the passivation layer or on the interlayer dielectric 20 when the passivation layer is omitted.

For embodiments omitting the passivation layer, the entire height of the image sensor can be reduced to realize a thinner image sensor and reduce the number of processes and costs.

The color filters 30 can include three different colored color filters to obtain a color image. For example, the color filters 30 can include a red color filter, a green color filter, and a blue color filter for filtering light of different wavelengths.

A dyed photoresist can be used as a material for forming the color filters 30. The color filters 30 can be provided corresponding to each of the unit pixels 11 to filter incident light. Adjacent color filters 30 may slightly overlap each other to have a height difference. Even in embodiments where the color filters 30 do not overlap, a height difference may exist.

Although not shown, a planarization layer can be formed on the color filters 30 to compensate for the height difference of the color filters 30.

Microlenses that will be formed through a subsequent process should be formed on a planarized surface. To this end, the height difference due to the color filters 30 should be removed. Thus, the planarization layer may be formed on the color filters 30. Of course, any suitable method of color filter formation can be used to provide a planar surface.

An inorganic layer 40 can be formed on the color filters 30.

The inorganic layer 40 can be formed of an inorganic material such as an oxide, a nitride, or an oxynitride. In one embodiment, the inorganic layer 40 can be formed of an oxide. In a specific embodiment, the oxide can be formed at a low temperature, such as from about 50° C. to 250° C., using a chemical vapor deposition (CVD), physical vapor deposition (PVD), or plasma-enhanced CVD (PECVD) process. In many embodiments, the inorganic layer 40 can be formed having a thickness in the range of about 2,000 Å to about 20,000 Å.

Figure 2:
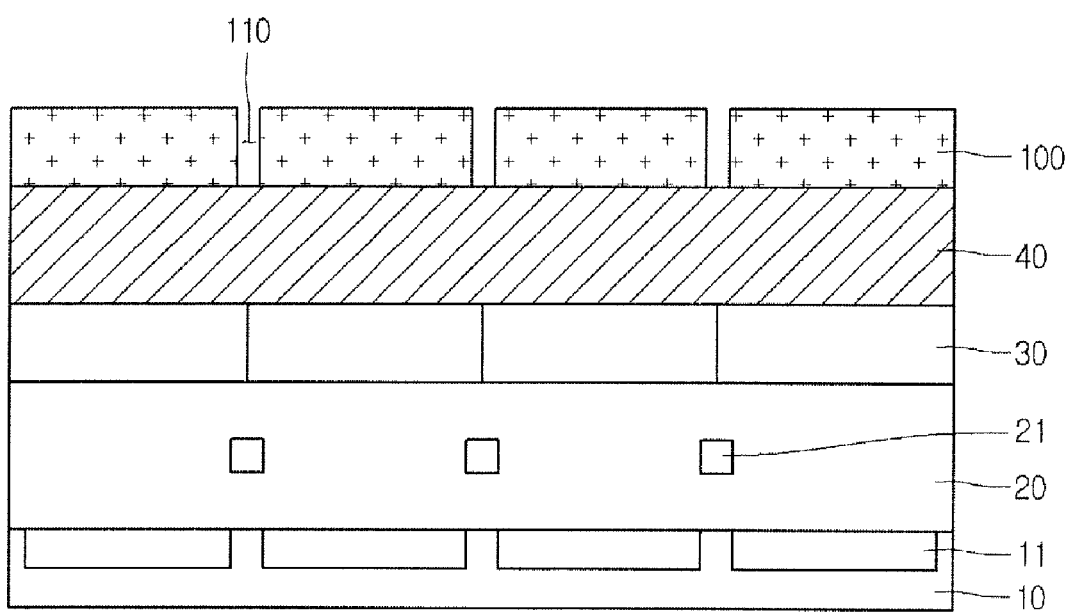

Referring to FIG. 2, first photoresist patterns 100 separated by first gaps 110 are formed on the inorganic layer 40.

The first photoresist patterns 100 can be obtained by coating a photoresist on the inorganic layer 40, and then performing exposure and development processes with respect to the photoresist. In certain embodiments, the first photoresist patterns 100 can have a thickness in the range of about 1,000 Å to about 2,000 Å.

The first gaps 110 of the first photoresist patterns 100 create a spacing to separate the microlenses, which will be formed through the subsequent process, such that each of the microlenses corresponds to each of the unit pixels 11. The first gaps 110 expose portions of the inorganic layer 40 corresponding to a portion of the area between the unit pixels 11.

Figure 3:
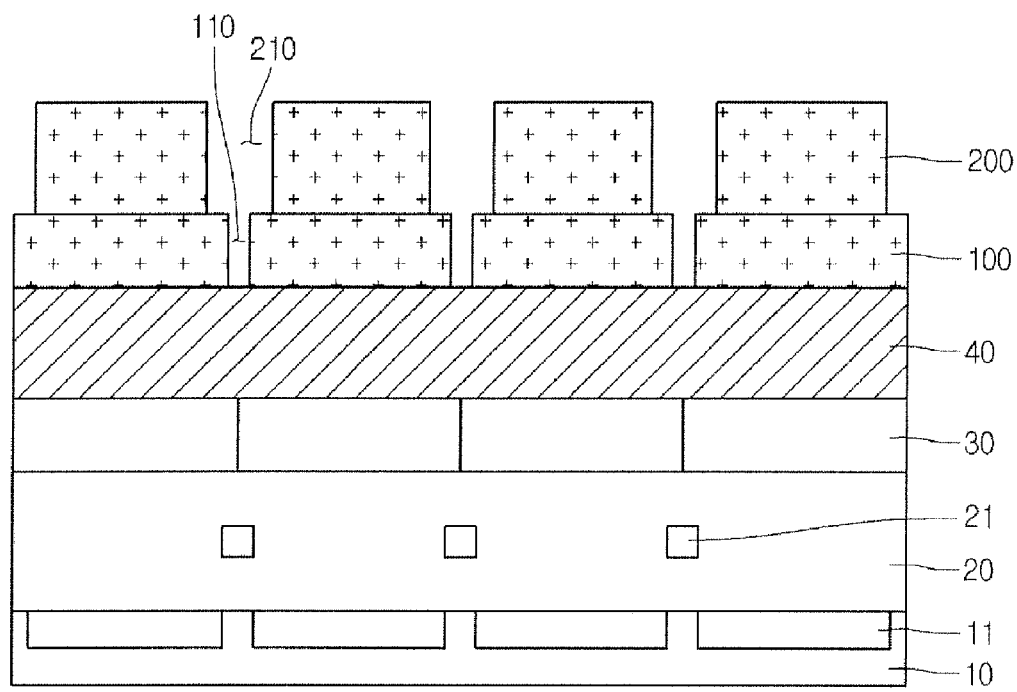

Referring to FIG. 3, second photoresist patterns 200 separated by second gaps 210 can be formed on the first photoresist patterns 100.

The second photoresist patterns 200 can be obtained by coating a photoresist on the substrate including the first photoresist patterns 100, and then performing exposure and development processes with respect to the photoresist. In certain embodiments, the second photoresist patterns 200 can have a thickness in the range of about 5,000 Å to about 10,000 Å.

The second gaps 210 of the second photoresist patterns 200 can have a greater diameter than the first gaps 110 of the first photoresist patterns 100. In addition, the second gaps 210 are provided to expose the inorganic layer 40 exposed through the first holes 110 and the edges of the first photoresist patterns 100.

Figure 4:
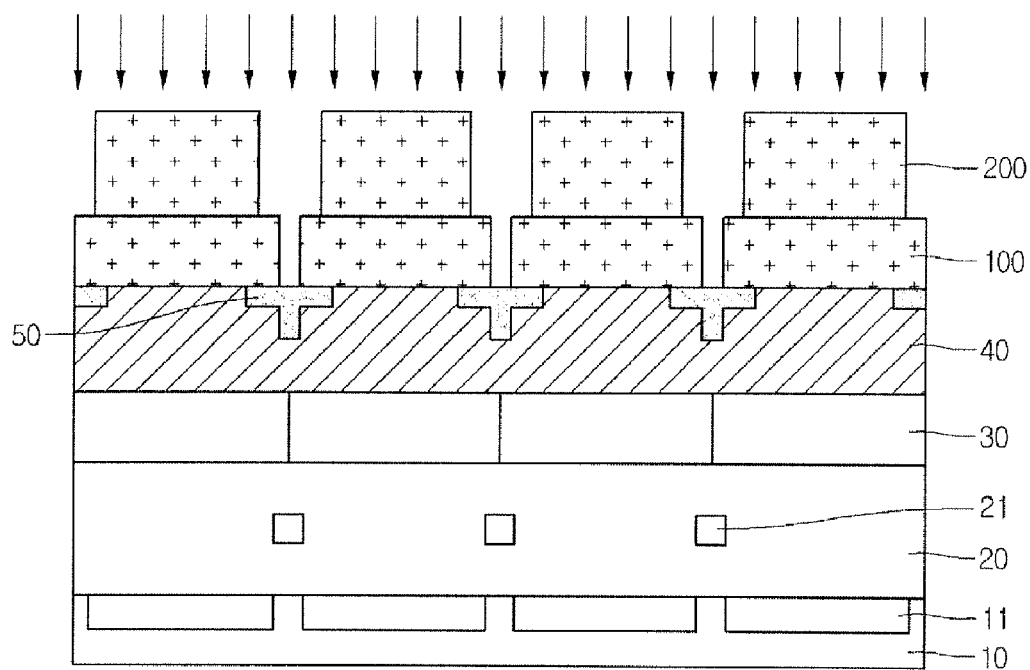

Referring to FIG. 4, the ion implantation regions 50 can be selectively formed in the inorganic layer 40 by performing an ion implantation process over the entire substrate on the inorganic layer 40 with the first and the second photoresist patterns 100 and 200. In one embodiment, the ions implanted into the inorganic layer 40 can be nitrogen ions.

That is, nitrogen ions can be implanted through the ion implantation process using the first and the second photoresist patterns 100 and 200 as a mask, so that portions of the inorganic layer 40 are doped with nitrogen ions.

In the ion implantation regions 50, the nitrogen ions are deeply implanted in the region of the inorganic layer 40 completely exposed by the first and the second gaps 110 and 210, and the nitrogen ions are shallowly implanted in the region of the inorganic layer 40 under portions of the first photoresist patterns 100 exposed by the second photoresist patterns 200. The nitrogen ions are not implanted in portions of the inorganic layer 40 under the overlapping portions of the first and the second photoresist patterns 100 and 200.

Thus, the ion implantation regions 50 have height differences due to the thickness of the first and the second photoresist patterns 100 and 200.

Figure 5:
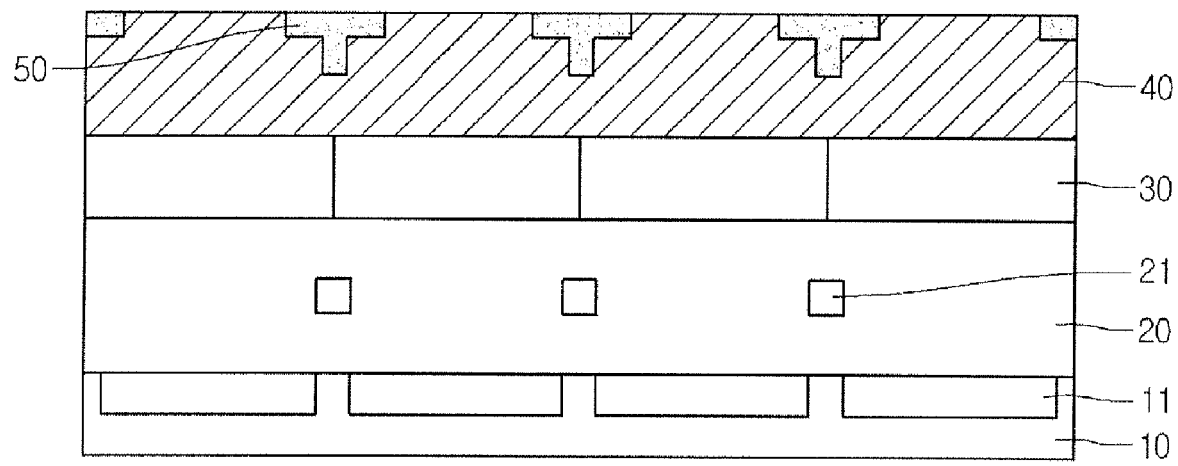

Referring to FIG. 5, the first and the second photoresist patterns 100 and 200 can be removed. Accordingly, ion implantation regions 50 remain in the inorganic layer 40. In one embodiment, the ion implantation regions 50 can be formed of a silicon oxynitride. This can be accomplished, for example, by the implantation of nitrogen ions into an oxide inorganic layer 40.

The ion implantation regions 50 can be formed in the portions of the inorganic layer 40 corresponding to the portions between the unit pixels 11. The ion implantation regions 50 can include a shallow wide portion and a deep middle portion at an upper region of the inorganic layer 40. The ion implantation regions 50 can be used to create height differences.

Figure 6:
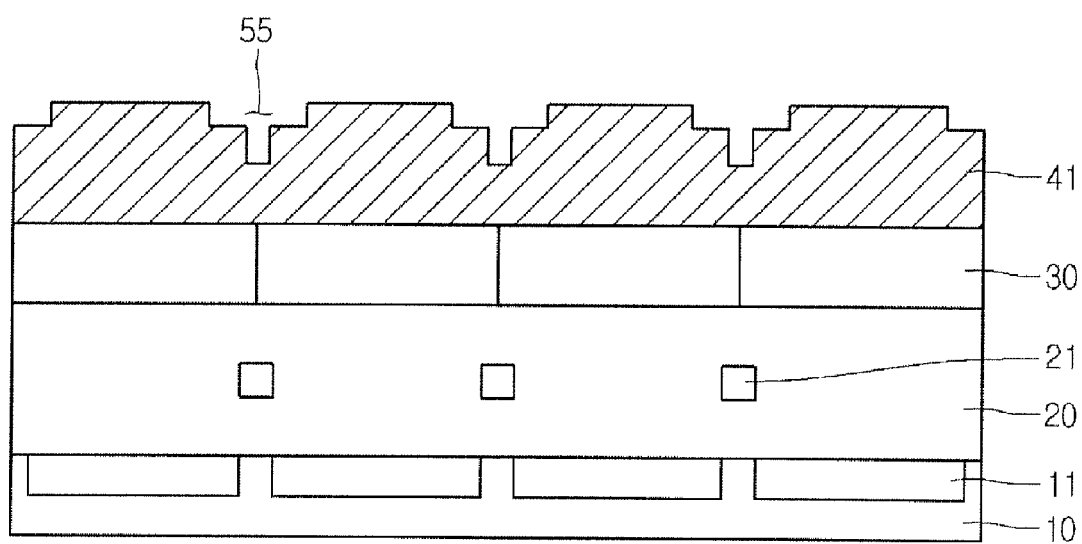

Referring to FIG. 6, the ion implantation regions 50 can be removed to form seed microlenses 41 having lens gap holes 55, In an embodiment, the ion implantation regions 50 can be removed using a wet etching process. For embodiments where the ion implantation regions 50 are formed of a silicon oxynitride and the inorganic layer 40 is formed of an oxide, the ion implantation regions 50 can be effectively removed using the wet etching process.

Once the ion implantation regions 50 formed in the inorganic layer 40 are removed, the seed microlenses 41 having the lens gap holes 55 can be provided in portions of the inorganic layer 40 corresponding to the area between the unit pixels 11.

The lens gap holes 55 each can have a shallow, wide upper portion and a deep middle portion based on the shape of the ion implantation regions 50.

Thus, the seed microlenses 41 can be formed in a pattern shape corresponding to unit pixels 11 by using the lens gap holes 55.

Figure 7:
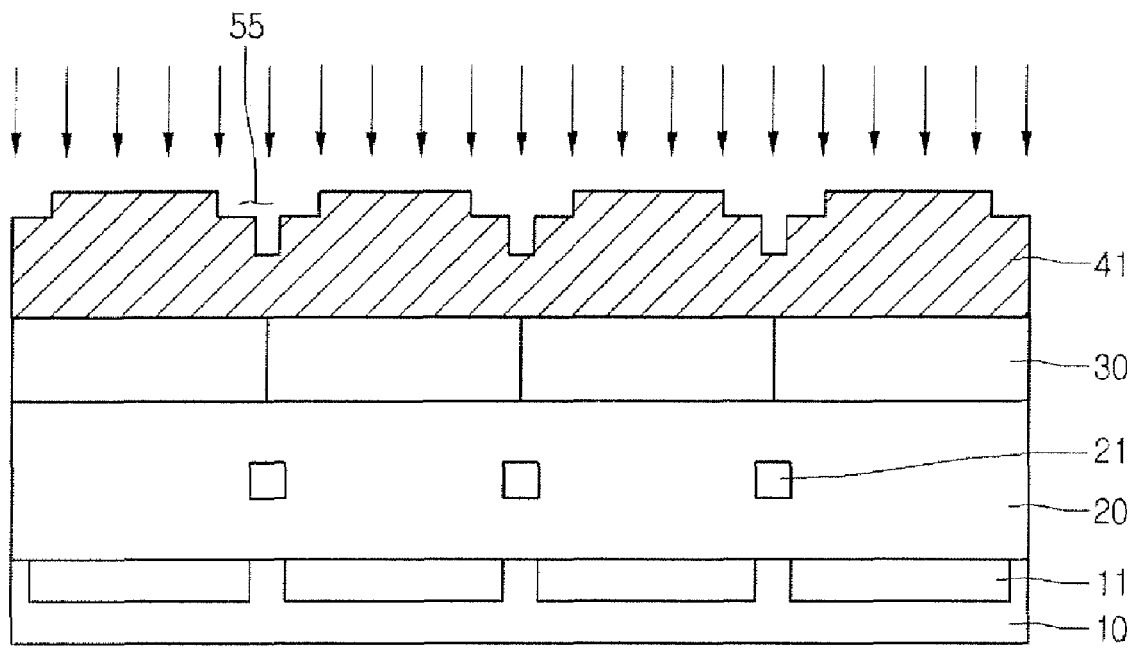

Referring to FIG. 7, an etching process can be performed on the seed microlenses 41 including the lens gap holes 55. In one embodiment, the etching process on the seed microlenses 41 can be a dry blanket etching process.

Plasma can concentrate at edges of the seed microlenses 41 during the dry etching process according to the characteristics of the dry etching process using the plasma.

Since the plasma is concentrated around the lens gap holes 55 of the seed microlenses 41, the seed microlenses 41 can formed in a convex dome shape following the shape of the lens gap holes 55.

Figure 8:
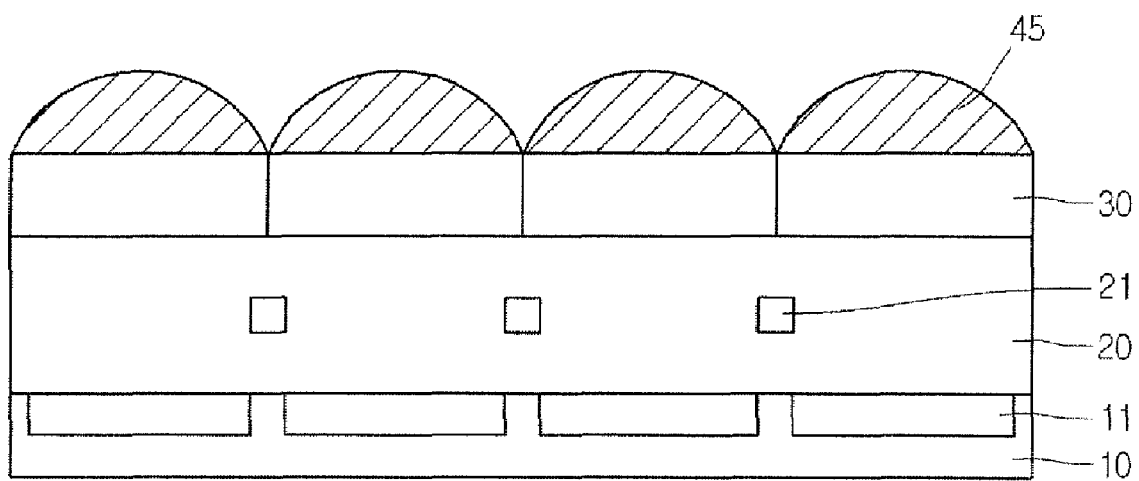

Referring to FIG. 8, dome-shaped microlenses 45 can be provided by the performing of the blanket etching process on the seed microlenses 41 as described with respect to FIG. 7.

The microlenses 45 can correspond to the unit pixels 11. Thus, incident light can be efficiently collected in the unit pixels 11.

By forming the microlenses 45 of an inorganic material, a crack due to physical damage can be inhibited from occurring.

A method of manufacturing the image sensor according to embodiments of the present invention can inhibit damage from particle accumulation and cracking by forming the microlenses of an inorganic material, thus improving the quality of the image sensor.

Also, the microlenses of the inorganic material can formed in a dome shape to improve the light collection efficiency of the photodiode.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an image sensor, comprising:
   providing a substrate defined with unit pixels;
   forming a seed microlens on the substrate, wherein a top surface of the seed microlens comprises a height difference between a first region of the seed microlens corresponding to one of the unit pixels and a second region of the seed microlens corresponding to an area between adjacent unit pixels; and
   forming a microlens by performing a blanket etching process on the seed microlens,
   wherein forming the seed microlens comprises:
   forming an inorganic layer on the substrate;
   selectively forming an ion implantation region in a portion of the inorganic layer corresponding to the area between adjacent unit pixels, wherein the forming of the ion implantation region comprises:
      forming a first photoresist pattern separated by a first gap exposing a first portion of the inorganic layer corresponding to a portion of the area between adjacent unit pixels,
      forming a second photoresist pattern on the first photoresist pattern, the second photoresist pattern being separated by a second gap exposing at least the first gap of the first photoresist pattern, and
      implanting ions into the inorganic layer using both the first and the second photoresist patterns as a mask; and
   removing the ion implantation region to form a lens gap hole in the inorganic layer,
   wherein the lens gap hole creates the height difference of the top surface of the seed microlens.

2. The method according to claim 1, wherein providing a substrate defined with unit pixels comprises:
   forming a plurality of unit pixels on a semiconductor substrate, wherein each unit pixel comprises a photodiode and metal oxide semiconductor transistor.

3. The method according to claim 2, further comprising, before forming the seed microlens:
   forming an interlayer dielectric and a metal interconnection on the semiconductor substrate, wherein the metal interconnection is electrically connected to the plurality of unit pixels.

4. The method according to claim 1, wherein the lens gap hole comprises:
   a shallow and wide trench-shaped upper portion; and
   a deep and narrow via-shaped middle portion.

5. The method according to claim 1, wherein the inorganic layer comprises a low temperature oxide.

6. The method according to claim 1, wherein the ion implantation region comprises silicon oxynitride.

7. The method according to claim 1, wherein the inorganic layer comprises a low temperature oxide.

8. The method according to claim 1, wherein the first photoresist pattern has a thickness between about 1,000 Å and about 2,000 Å.

9. The method according to claim 1, wherein the second photoresist pattern has a thickness between about 5,000 Å and about 10,000 Å.

10. The method according to claim 1, wherein the second gap of the second photoresist pattern has a greater diameter than the first gap of the first photoresist pattern.

11. The method according to claim 1, wherein the implanting of the ions comprises implanting nitrogen ions.

12. The method according to claim 1, wherein the removing of the ion implantation region comprises performing a wet etching process.

13. The method according to claim 1, wherein the blanket etching process forms the microlens in a dome shape having a curvature following the height difference of the top surface of the seed microlens.

* * * * *